United States Patent [19]

Edwards

[11] Patent Number: 5,074,206
[45] Date of Patent: Dec. 24, 1991

[54] PRINTING METHOD AND PRINTED PRODUCT

[76] Inventor: Wallace Edwards, P.O. Box 1265, Station B, Weston Ontario, Canada, M9L 2R9

[21] Appl. No.: 667,757

[22] Filed: Mar. 11, 1991

Related U.S. Application Data

[63] Continuation of Ser. No. 302,539, Jan. 25, 1989, Pat. No. 4,998,962.

[51] Int. Cl.$^5$ ............................................. B41M 1/14
[52] U.S. Cl. ........................... 101/211; 101/401.1; 430/394; 430/301; 358/459
[58] Field of Search ................ 101/211, 463.1, 401.1, 101/151–152, 490, 395, 483, 485, 486, 469, 35, 40, 38.1, 177, 135; 358/75, 77, 80, 429, 456, 459; 355/32, 77; 430/6, 7, 300, 394

[56] References Cited

U.S. PATENT DOCUMENTS

| | | | |
|---|---|---|---|
| 3,223,028 | 12/1965 | Brigham | 101/40 |
| 3,227,070 | 1/1966 | Brigham et al. | 101/40 |
| 3,288,059 | 11/1966 | Atkinson | 101/211 |
| 3,371,603 | 3/1968 | Brigham | 101/177 |
| 3,381,612 | 5/1968 | Lecha | 101/211 |
| 3,385,209 | 5/1968 | Freres | 101/38.1 |
| 3,420,170 | 1/1969 | Smith | 101/211 |
| 3,429,702 | 2/1969 | Lorber | 101/211 |
| 3,564,130 | 2/1971 | Crooks | 358/459 |
| 3,645,201 | 2/1972 | Jackson | 101/40.1 |
| 3,752,073 | 8/1973 | Lorber | 101/211 |
| 3,922,484 | 11/1975 | Keller | 358/459 |
| 3,939,769 | 2/1976 | Lorber | 101/211 |
| 3,948,171 | 4/1976 | O'Connell | 101/40 |
| 4,012,257 | 3/1977 | Geris | 430/301 |
| 4,028,105 | 6/1977 | Uno et al. | 439/301 |
| 4,035,214 | 7/1977 | Shuppert et al. | 101/40 |
| 4,037,533 | 7/1977 | Rapoport et al. | 430/301 |
| 4,081,828 | 3/1978 | Jones et al. | 101/135 |
| 4,241,657 | 12/1980 | Fujimori | 101/40 |
| 4,265,469 | 5/1981 | Mowry, Jr. et al. | 101/211 |
| 4,283,471 | 8/1981 | Sportelli | 430/7 |
| 4,286,385 | 9/1981 | Huck | 101/211 |
| 4,301,232 | 11/1981 | Kullen | 101/211 |
| 4,365,275 | 12/1982 | Berman | 358/459 |
| 4,513,922 | 4/1985 | May et al. | 101/194 |
| 4,519,310 | 5/1985 | Shimizu et al. | 101/35 |
| 4,554,241 | 11/1985 | Edwards | 101/211 |
| 4,604,654 | 8/1986 | Sakurada et al. | 358/459 |
| 4,629,428 | 12/1986 | Phillips | 434/98 |
| 4,651,228 | 3/1987 | Koch | 358/456 |
| 4,668,597 | 5/1987 | Merchant | 430/302 |
| 4,768,101 | 8/1988 | Webb | 358/459 |
| 4,774,885 | 10/1988 | Chmielnik | 101/151 |
| 4,803,523 | 2/1989 | Pearson | 355/77 |
| 5,010,814 | 4/1991 | Shishikura | 101/211 |

FOREIGN PATENT DOCUMENTS

| | | |
|---|---|---|
| 63-126750 | 5/1988 | Japan . |
| 63-162240 | 7/1988 | Japan . |
| 63-162241 | 7/1988 | Japan . |

Primary Examiner—Eugene H. Eickholt
Attorney, Agent, or Firm—Thomas R. Vigil

[57] ABSTRACT

A method of printing with at least two printing plates, or their equivalent, characterized in that associated halftone dots belonging to two distinct pluralities, each of which is printed with one of said two printing plates, and each of which are interleaved with the other and printed in a color different from the other, are separated by a gap when printed in perfect register.

2 Claims, 3 Drawing Sheets

PRINTING METHOD AND PRINTED PRODUCT

This application is a continuation of application Ser. No. 07/302,539 filed Jan. 25, 1989 now U.S. Pat. No. 4,998,962.

BACKGROUND OF THE INVENTION

1. Field of the Invention

The present invention relates to printing techniques in general and to what is known as halftone printing in particular. More particularly still, it relates to printing with more than a single printing plate. The preferred embodiment of the present invention is directed to printing on metal cans or the like, also known as metal decorating.

2. Description of the Prior Art

U.S. Pat. No. 3,948,171 granted Apr. 6, 1976 to Richard E. O'Connell and titled: Method For Printing Multicolor Halftone Images on Cylindrical Objects provides a novel method and apparatus for producing halftone effect printing using line-engraves press plates for printing cylindrical objects, particularly cans of the tow-piece type. The patent, under the heading "Description of the Prior Art" provides a brief but useful discussion of problems in multicolor printing on two-piece cans at that time. Beginning at Column 1, line 36 the patent states:

> "The printing techniques that have been developed for this so-called two-piece can construction are necessarily modified to provide for offset printing of multicolor images by direct application to the cylindrical surface. The methods employed include the formation of printing plates for each of several colors to be applied to the work. The traditional halftone lithograph effect by the use of printing mats prepared by the use of color separation, halftone dot or grid type screens and press plates, and overprinting have not been attainable in two-piece can printing since the problems of securing registry, proper printing pressure, angle of screen and plate, and the like to achieve the desired halftone effect attained by overprinting using halftone plates is, as a practical matter, difficult to accomplish.
>
> "The traditional grid or dot type screens used to form the halftone printing plates for multicolor printing produces a plate in which the printing surface is, in effect, a plurality of tiny raised dots or islands. The amount of color applied by each of the halftone plates was determined by the presence of and size of each of these dots, each of which, in turn, were formed photographically by traditional color separation and photoengraving techniques using appropriate filters and a halftone screen or grid. For each color, the grid and the resulting press plate is angled slightly to result in partial overprinting. The final composite multicolor shaded or toned printing product is achieved by overprinting and by optical blending, producing a visual effect of the desired tones or blends of color. Since each of the small dots formed in the press plate are fragile, the mechanical stress encountered in the application of each color to the offset surface or blanket results in smearing of the individual dots by the mechanical bending action encountered in the contact between the press plate and the surface of the offset blanket. This is especially true in the preparation of so-called flexible halftone press plates where the plate is formed by a chemical photoengraving method. In this procedure the plate is formed of a flexible, rubbery or polymeric material which has a photosensitive surface. On exposure to light, the photosensitive material is activated or hardened so that further treatment or etching, as by solvent, dissolves away the unexposed portions leaving a raised printing surface formed of a multitude of dots which corresponds to the particular color image applied to the plate. Since the base supporting the raise or printing portion is flexible, each printing operation flexes each dot and tends to smear the image and can also break the dots off.
>
> "Understandably, the quality of the images will deteriorate rapidly under, these stresses, and such indeed is the experience in the can lithographing art. Likewise, the achievement of tone or color blend by traditional offset multicolor halftone techniques requires very accurate registry, careful angulation of the screens and press plates, accurate pressures, and more particularly, evenness of printing pressures. These desiderata were not attainable in the high speed printing techniques used for cylindrical objects or cans and required !or economic operation in this industry. The result has been that halftone effects are not reproducible by any of the known standard multicolor offset or lithographic printing techniques which have been employed to date in the printing of two-piece cans.
>
> "Some of the prior art patents which deal with high speed can printing of two-piece metal cans include: Brigham, et al., U.S. Pat. No. 3,227,070; Brigham, U.S. Pat. Nos. 3,223,028 and 3,371,603; Freres, U.S. Pat. No. 3,385,209; and Maxin, U.S. Pat. No. 3,645,201. None of these patents, however, teach the successful use of a halftone color blend visual effect in high speed printing and all use solid color printing techniques."

The O'Connell solution to the above quoted problems is succinctly stated in clause d of claim 1 as:

> "forming a series of line-engraved press plates from said line screen transparencies wherein each press plate corresponds to one of the colors in the original art work and wherein the printed image from each of said press plates is separated from the color image of the other plates by the field color and the printing lines of the respective press plates are parallel to each other and run in the direction of printing."

U.S. Pat. No. 4,035,214 granted July 12, 1977 to Laurence Verlan Shuppert et al and titled: Total Image Transfer Process teaches a radically different process from that of O'Connell as stated in the Abstract:

> "Process for transferring overlayed multiple ink patterns from the surface of a release blanket to a receiving surface on a container or other formed article being printed. A substantially transparent film is first formed on the release blanket, with each ink pattern being printed sequentially over this release film. Proper printing on the release film without picking the release film or previously applied ink films is obtained when certain adhesive and cohesive relationships are maintained between the ink films and the release film. An adhesive film may be formed on the article to be printed, or it may be formed over the ink films and the release film on the release blanket. The receiving surface on the article to be printed is brought into contact with the films on the release blanket, with a resulting total transfer of the films on the blanket to the surface of the article."

The Shupper patent also discusses the difficulties of applying conventional multi-color offset printing to formed containers and states that the necessity of precise registration of color patterns greatly slows the handling of the articles.

U.S. Pat. No. 4,241,657, granted Dec. 30, 1980 to Hikoichiro Fujimori and titled Four-Color Halftone Printing Process For Objects Having Curved Surface, provides yet another solution as stated in the Abstract:

"A process of four-color halftone printing onto objects having a curved surface by means of dry offset printing which comprises transferring four images of yellow, magenta, cyan and black process inks having a difference of at least 1 in tackiness value from each other from four blocks onto two transfer areas provided on a blanket differently in the circumferential direction of a blanket cylinder in two layers two by two so that an image of an ink having the highest tackiness value and an image of an ink having the secondarily high tackiness value are transferred onto the first transfer area in that order and an image of an ink having the thirdly high tackiness value and an image of an ink having the lowest tackiness value are transferred onto the second transfer area in that order, and then transferring the images on the first transfer area and the images on the second transfer area in order onto the object having a curved surface in layers. Improved four-color halftone printing apparatus for objects having a curved surface is provided with a blanket cylinder having an effective printing surface of twice the size of the printing surface of the objects. The reproducibility of color and images is very excellent and the printing closely resembling the original can be obtained".

U.S. Pat. No. 4,774,885, granted Oct. 4, 1988 to Reinhold Chmielnik and titled Printing Process Overlapping Multi-Color Dot Images provides a process whereby a multi-color halftone image of an original object is formed on preformed plastic containers or other recipient surface by printing such image while wet from an offset blanket cylinder on which the image is formed by overlying a plurality of one-color halftone images. In column 3, lines 7-16, it is stated that:

"The individual one-color half-tone images print sequentially on the offset blanket cylinder, with the individual dots of sequential colors standing alone therefor overlapping or registering, as dictated by the color separation of the original photograph. At locations of dot overlap or registry, the colors blend. In this way, a four-color half-tone image, which is a reproduction of the originally photographed object, is obtained in a wet-form, suitable for printing onto a recipient surface, preferably a preformed article, such as, a plastic container."

SUMMARY OF THE INVENTION

The solution provided by O'Connell in U.S. Pat. No. 3,948,171 for the problems discussed above was to use line-engraved press plates instead of press plates engraved with halftone dots.

The present invention, in its broadest aspect, provides another, simple, solution by printing with at least two printing plates, or their equivalent, characterized in that associated halftone dots belonging to two distinct pluralities, each of which is printed with one of said two printing plates, and each of which are interleaved with the other and printed in a colour different from the other, are separated by a gap when printed in perfect register.

By associated halftone dots is meant those dots, one set in each printing plate, that when printed in register were intended to partially overlap. I.e., those dots belonging to the same raster point or location during the scanning of the original by an optical-electronic scanner to provide the film for exposing the printing plates. Optical-electronic scanners are now widely used to provide the film, such as the scanner described in U.S. Pat. No. 3,878,559, assigned to Crosfield Electronics Limited.

In addition to indirect printing plate making using film, U.S. Pat. Nos. 4,610,949 and 4,774,165, both assigned to Mitsubishi Paper Mills. Ltd., disclose methods for the direct making of printing plates from an original.

It should be noted, of course, that the printing method of the present invention would be meaningful only where dot overlap is not necessary or desired.

It should be noted further that, as in other multiprinting plate methods, a different screen angle is necessary for each printing plate in order to minimize the so-called moire patterns in the printed product. A general reference book on this and other graphic arts subjects is the "Pocket Pal" by Michael H. Bruno, Editor, published by the International Paper Company of Memphis, Tenn., U.S.A., in 1988, which book is incorporated herein by reference.

Other screening methods for multi-plate printing are also known and are equally applicable. For example, the method disclosed in U.S. Pat. No. 4,700,235, assigned to Dr. Ing. Rudolf Hell GmbH.

The present invention also provides a printed product having at least two distinct pluralities of printed halftone dots characterized in that the first plurality of halftone dots does not overlap substantially with the second plurality of halftone dots.

The present invention is particularly advantageous for printing on cans or the like by retaining the standard halftone printing techniques, but making registration less critical, thereby permitting high speed and productivity of the can decorating machine. Furthermore, smudging and contamination of ink (problematic for printing on metal) are reduced, the more so the larger the halftone dot separation. It has been found that for a relatively coarse screen of 65 dots per inch, a dot separation of up to 5 thousandths of an inch is tolerable. Given a decorating machine of the highest quality such as that manufactured by Rutherford of East Rutherford, N. J. U.S.A., model CD2-1500, with colour-to-colour registration accuracy of one thousandth of an inch, the halftone dots may be permitted to abut each other and still provide acceptable results.

Generally, the dot gap or separation will depend on several factors, such as, the number of printing plates, the screen density, the precision of registration, the quality of ink, the nature of the printing surface, and so forth. Some experimentation may be necessary before determining the optimal separation.

BRIEF DESCRIPTION OF THE DRAWINGS

The preferred embodiment of the present invention will now be described in conjunction with the attached drawings, in which.

DESCRIPTION OF THE PREFERRED EMBODIMENT

Figure 1:
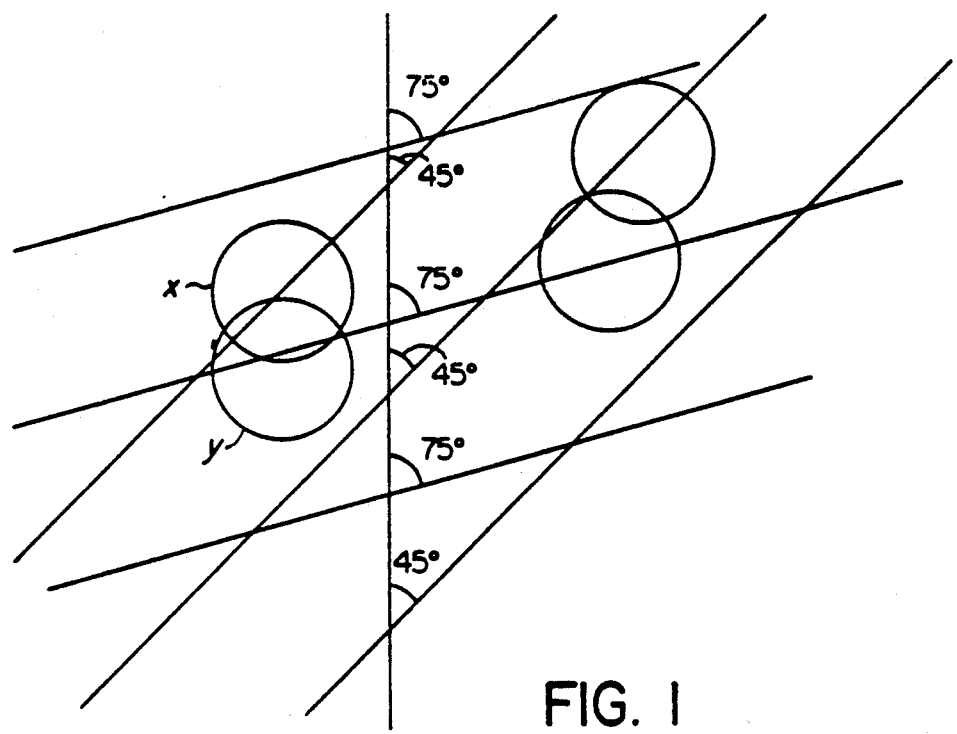
FIG. 1 is a schematic illustration of two superposed screens, one at a 45° angle and the other at a 75° angle, illustrating halftone dot partial overlap of two separation films.

FIGS. 1 to 9 in the drawings are representative only and show halftone dots greatly enlarged and idealized in shape for purposes of illustration and description. U.S. Pat. No. 4,629,428 shows some of the possible shapes and patterns of dots on halftone screens. Moreover, separation films as produced today are mostly the product of the electronic scanners which generate "screened" film without using an actual physical screen.

Figure 2:
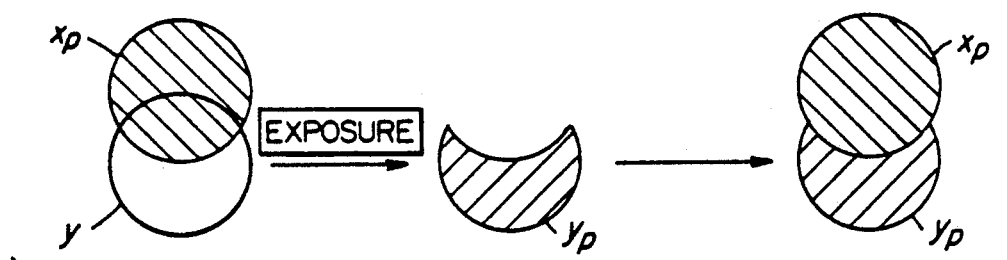
FIG. 2 illustrates steps in the process of obtaining separated halftone dots according to the present invention from two overlapping dots illustrated in FIG. 1.
Figure 3:
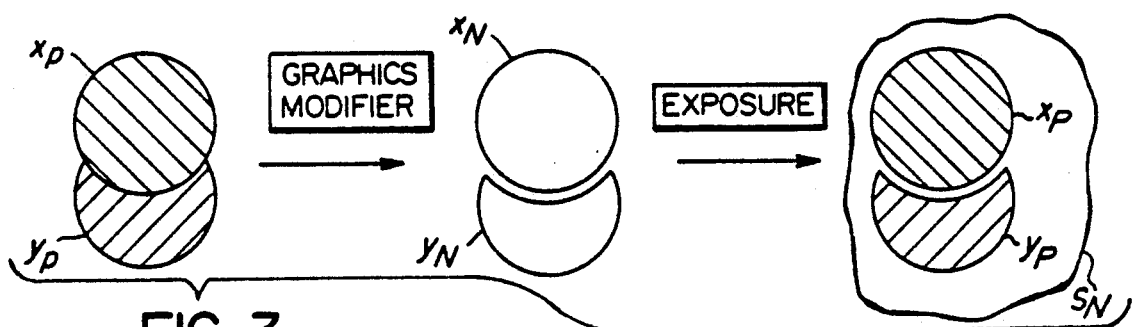
FIG. 3 illustrates further steps in the process.
Figure 4:
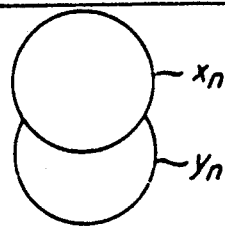
FIG. 4 illustrates non-overlapping but unseparated halftone dots according to the present invention.
Figure 5:
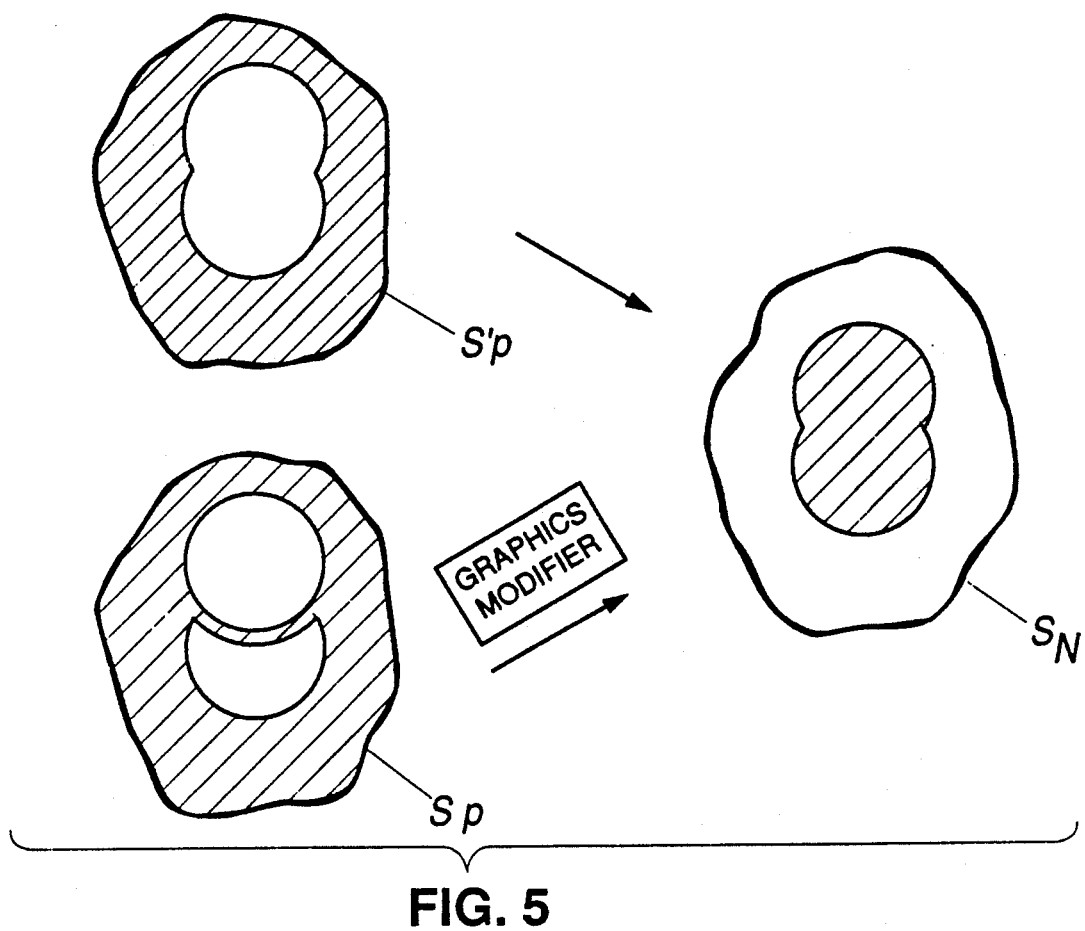
FIG. 5 illustrates further steps in the process.

Turning now to FIG. 1 of the drawings, it illustrates two superposed screens at angles of 45° and of 75° with the vertical, respectively. One pair of partially overlapping halftone dots having the same shape and size will be used to explain the steps of the method of the preferred embodiment for generating two separation negatives for exposing printing plates wherein the halftone dots of the one separation negative are separated from, or do not overlap, those in the other separation negative. We begin with two conventionally produced separation negative films, one for printing with a colour X and the other for printing with a colour Y. Conveniently, the dots are identified in FIG. 1 as x and y, and belong to the 45° screened film and the 75° screened film, respectively. The 45° and 75° angles are standard screen angles as explained in the "Pocket Pal", above-mentioned, on page 96. The processing steps are as follows:

1. Take the separation negative for the colour X and make a contact positive thereof;
2. Take the positive from step 1 (represented by dot $x_p$ at the left of FIG. 2) and overlay it onto and in registration with the separation negative for the colour Y (represented by dot y at the left of FIG. 2). Both $x_p$ and y are used to expose, preferably a contact film. The result, which is a positive, is represented by the dot $y_p$ in the middle of FIG. 2, which is a positive of y wherein the overlap region x is removed. The two positives $x_p$ and $y_p$ when overlayed in registration would have abutting dots as shown at the right of FIG. 2; and
3. Now each of the two positives $x_p$ and $y_p$ are taken and "choked" separately to produce two choked negatives $x_N$ and $y_N$ as represented in FIG. 3. The choking is accomplished by means of a commercially available apparatus called a "Graphics Modifier" available from Byers Corporation of Oklahoma City, Okla., U.S.A., such as those sold as models 1500 or 3500 Digital. The choking by such a graphics modifier causes a "shrunk" or decreased negative image to be generated from the positive. The two choked negatives $x_N$ and $y_N$ are the films corresponding to the original separation films, but with the dots separated in print, and may be used to expose the two respective printing plates in the conventional manner. Now let us assume that, as may be advantageous for printing on two-piece cans, three piece cans or other objects, that a background or surrounding colours is desired. For this a third separation negative film would be required, which will be derived according to the following additional steps, preferably from the choked negatives $x_N$ and $y_N$ (in FIG. 3), (or possibly from the positives $x_p$ and $y_p$ in FIG. 2):
4. The choked negatives $x_N$ and $y_N$ are taken separately and a composite contact positive $s_n$, shown at the right of FIG. 3, is made by exposing a film sequentially, first to the one negative and then to the other, all in registration.
5. Take the composite contact positive $s_n$ and make a contact positive $s_p$ thereof, shown at the bottom left of FIG. 5. (The top left positive $S'_p$ would have been that made from the positives $x_P$ and $y_P$ and could be used instead of $S_p$ to produce the next step, even though it is preferable to use $S_P$.
6. A choked negative $s_N$ (at the right in FIG. 5) is made from the positive $s_P$ by means of the graphics modifier. The negative $s_N$ is the third separation film for exposing a third printing plate for printing the background. The result of printing with the three plates exposed by $x_N$, $y_N$ and $s_N$ is shown in FIG. 6, where the shaded areas represent absence of printing ink, showing that none of the inks of the colours X, Y and S overlap, thereby avoiding contamination.

Figure 6:
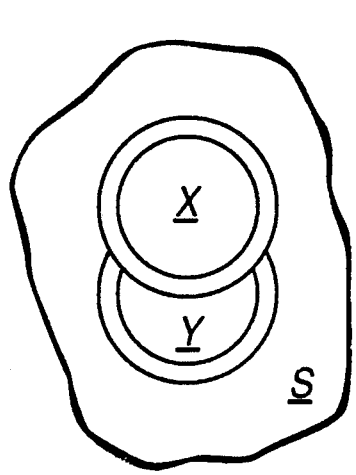
FIG. 6 illustrates the printing result derived from three separation negatives in the immediate vicinity of two halftone dots, where the shaded areas represent absence of ink.
Figure 7:
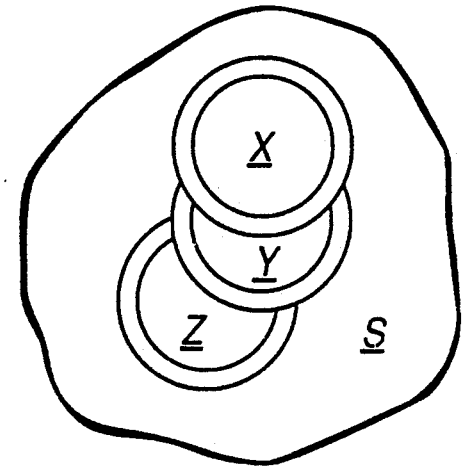
FIG. 7 illustrates an extension of FIG. 6 wherein a further halftone dot from a fourth separation negative is included.

In FIG. 7, there is shown a similar result to that shown in FIG. 6, except that here a fourth printing plate for the colour Z was used at a screen angle of 105°.

Figure 8:
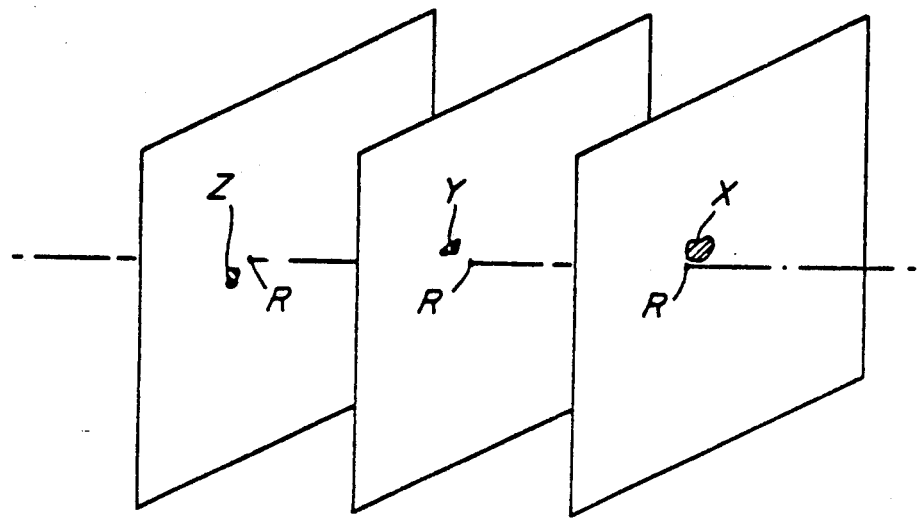
FIG. 8 illustrates three aligned printing plates viewed from the back (or three separation negatives viewed from the front) explaining the dot separation in the immediate vicinity of an arbitrary raster point.
Figure 9:
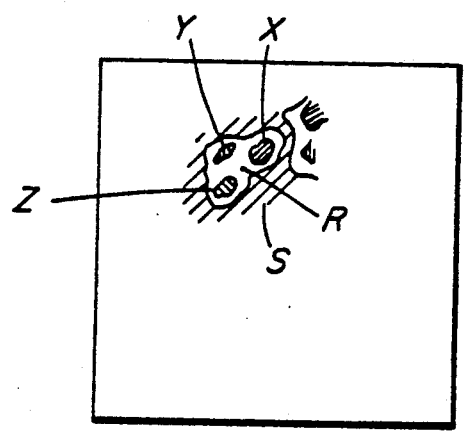
FIG. 9 illustrates the result of printing on a surface with the three printing plates shown in FIG. 8, plus a fourth printing plate.

FIG. 8 is a perspective view illustrating three printing plates showing the relative positions of three halftone dots of arbitrary shape and size in the immediate vicinity of associated raster point R in the original picture. When printed on the surface of a product as shown in FIG. 9, the three dots do not overlap, nor does anyone of them overlap with the surrounding background S, if printed with an additional printing plate.

It should be understood that the method of the present invention may be carried out by different apparatus than those mentioned in this description. For example, it is possible to bypass the graphics modifier by programming an optical-electronic scanner to produce choked dot negatives directly. In this description, however, the aim was to show the feasibility of practicing the invention with the existing technology and expertise as is in common use today.

What is claimed is:

1. A method of printing with at least two printing plates, or their equivalent, one for printing halftone dots and the other for printing a solid background colour, characterized in that the halftone dots are surrounded by the background colour and are separated therefrom by a gap when printed in register, as well as the background colour fills in interstitial spaces between dots separated by more than a few thousandths of an inch.

2. The method of printing with at least two printing plates as defined in claim 1, wherein each printing plate has been obtained by exposure through a separation film or its equivalent.

* * * * *